United States Patent [19]

Leonberger et al.

[11] 4,376,285
[45] Mar. 8, 1983

[54] HIGH SPEED OPTOELECTRONIC SWITCH

[75] Inventors: Frederick J. Leonberger, Lexington; Frederick J. O'Donnell, Billerica, both of Mass.

[73] Assignee: Massachusetts Institute of Technology, Cambridge, Mass.

[21] Appl. No.: 162,073

[22] Filed: Jun. 23, 1980

[51] Int. Cl.³ .................... H01L 27/12; H01L 27/48; H01L 29/161; H01L 27/14
[52] U.S. Cl. ........................................ 357/17; 357/4; 357/15; 357/16; 357/30; 357/61
[58] Field of Search .................... 357/30, 16, 17, 61, 357/4, 35; 250/370; 338/15, 17

[56] References Cited

U.S. PATENT DOCUMENTS

| | | | |
|---|---|---|---|
| 3,013,232 | 12/1961 | Lubin | 338/170 R |
| 3,588,637 | 6/1971 | Jaklevic et al. | 357/4 XR |
| 3,700,980 | 10/1972 | Belasco et al. | 357/35 R X |
| 3,917,943 | 11/1975 | Auston | 357/30 X |
| 4,030,840 | 6/1977 | Lawton et al. | 356/256 O |
| 4,064,521 | 12/1977 | Carlson | 357/30X |
| 4,268,844 | 5/1981 | Meiners | 357/30 X |
| 4,276,137 | 6/1981 | Hovel et al. | 357/30 X |

OTHER PUBLICATIONS

D. H. Auston, "Picosecond Optoelectronic Switching and Gating", *Applied Physics Letters*, vol. 26, No. 3, pp. 101–103 (1975).
C. H. Lee, "Picosecond Optoelectronic Switching in GaAs", *Applied Physics Letters*, vol. 30, No. 2, pp. 84–86, (1977).
R. A. Lawton and A. Scavannee, *Electron. Lett.*, vol. 11, No. 74, pp (1975).
H. C. Casey, Jr. and E. Buehler, "Evidence for Low Surface Recombination Velocity on N-Type InP", *Applied Physics Letters*, vol. 30, No. 5 (1977) pp. 247–249.
C. W. Iseler, "Properties of InP Doped with Fe, Cr, or Co" in: *Gallium Arsenide and Related Compounds* 1978, Institute of Physics Conference Serial Number 45, Chapter 2, pp. 144–153.
S. Sakai, M. Umena and Y. Amemiya, "Measurement of Diffusion Coefficient and Surface Recombination Velocity for P-InAsAsP Grown InP", *Japanese Journal of Applied Physics*, vol. 19, No. 1, (1980) pp. 109–113.

*Primary Examiner*—Martin H. Edlow
*Assistant Examiner*—J. Carroll
*Attorney, Agent, or Firm*—Arthur A. Smith, Jr.; Leo R. Reynolds

[57] ABSTRACT

An optoelectronic switch has been formed from a semi-insulating substrate of indium phosphide doped with a deep level impurity and disposed intermediate a microstrip transmission line. One conductor of the transmission line has a small gap in its metallization. Upon illumination of the gap by laser pulses which are absorbed near the semiconductor surface, a photogenerated electron-hole plasma forms thereby providing a conducting path across the gap turning the switch "on."

A process of fabricating the switch is described, an important feature of which is a heat-treatment process which improves the response time of the switch to ~50 picoseconds. Another important part of the invention is the formation of an optically semi-transparent metallic film at the gap surface. This provides greater efficiency in the coupling of light into the device at the gap while at the same time maintaining a short electronically non-conductive gap and thus a relatively low ON-state impedance for the switch.

16 Claims, 17 Drawing Figures

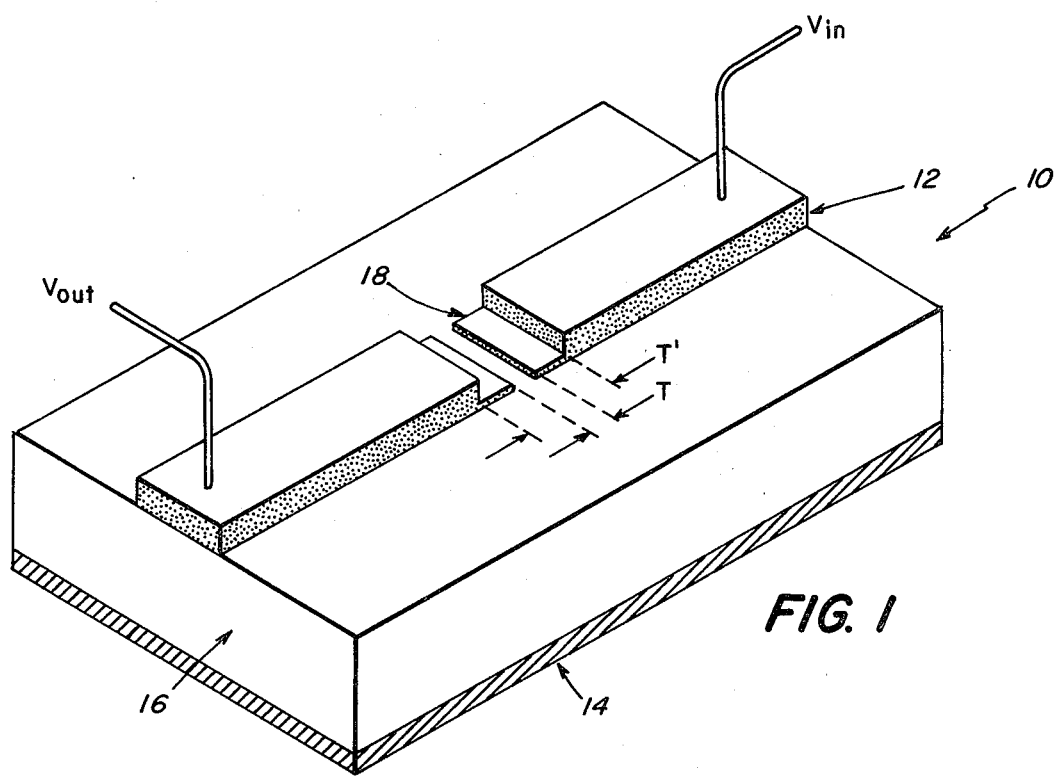
FIG. 1
FIG. 2a
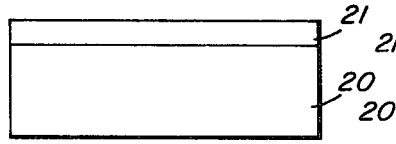
FIG. 2b
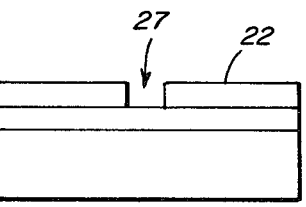
FIG. 2c
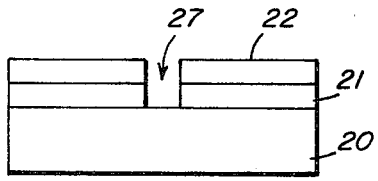
FIG. 2d
FIG. 2e
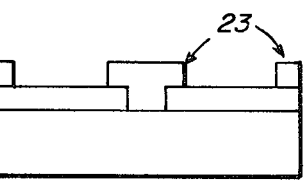
FIG. 2f
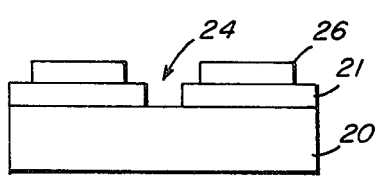
FIG. 2g
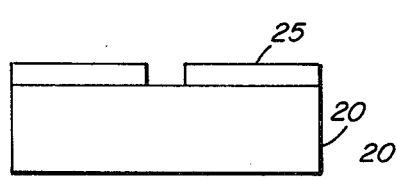
FIG. 2h
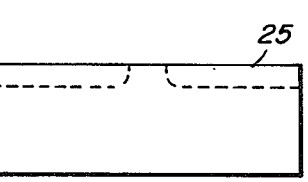
FIG. 2i
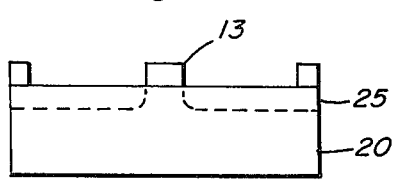
FIG. 2j
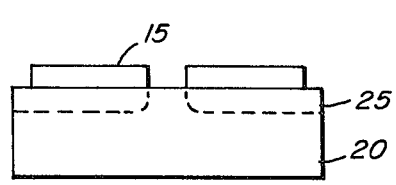
FIG. 2k

HIGH SPEED OPTOELECTRONIC SWITCH

DESCRIPTION

GOVERNMENT SUPPORT

Work described herein was supported by the United States Air Force and the United States Army under respective contracts F19628-80-C-0002 and F19628-79-C-0002.

TECHNICAL FIELD

This invention is in the field of solid state optoelectronic devices.

BACKGROUND ART

A need exists for a wide band analog signal processing device having a bandwidth in the order of 1 gigahertz (GHz) or greater. Applications for these devices exist in the fields of radar, electronic warfare and transient recording. As the bandwidth increases beyond the 1 GHz range, it becomes necessary to utilize devices other than simple electronic components. In this respect, a device of excellent promise called an optoelectronic switch has been developed. In an optoelectronic switch, an optical pulse such as may be provided from a laser is used to turn on and off an electrical signal. Such a switch has a number of advantages over electronic switches, the most significant being the complete isolation provided between the switching command signal from the laser and the analog signal which is being switched. Incomplete isolation can be a severe source of signal distortion. Also, with an optoelectronic switch, it is possible to take advantage of the short, high repetition rate pulses from mode-locked lasers to perform electronic waveform switching, detection and modulation at rates and resolution far exceeding those obtainable in an all electronic circuit.

An early optoelectronic switch is described in *Applied Physics Letters*, Vol. 26, No. 3 (Feb. 1, 1975) in an article by D. H. Auston of Bell Laboratories entitled "Picosecond Optoelectronic Switching and Gating in Silicon." The Auston device consists of a thin slab of high resistivity ($10^4$ ohm-cm) silicon on which a microstrip transmission line was fabricated. The microstrip line consisted of a uniform aluminum ground plane on the bottom and a narrow aluminum strip for an upper conductor. The upper conductor had a gap of high resistance which in the "Off" state prevented the transmission of a signal across the device. A 0.53 micrometer ($\mu$m) pulse from a mode-locked neodymium glass laser was projected on the gap and produced a thin high conductivity region near the top surface of the silicon crystal. This turned on the switch to the "On" state permitting the signal to be transmitted across the circuit. A second optical pulse of 1.06 $\mu$m was used to close the gate. This 1.06 $\mu$m pulse, because of its wave length, was able to penetrate the crystal to the ground plane shorting the transmission line and preventing further transmission by totally reflecting the incident electrical wave. The early optoelectronic switch of Auston was improved by Chi H. Lee as reported in *Applied Physics Letters*, Vol. 30, No. 2 (Jan. 15, 1977) in an article entitled "Picosecond Optoelectronic Switching in GaAs." In the Lee device, the silicon substrate was replaced by a Gallium Arsenide (GaAs) slab mounted on an alumina insulator. The gallium arsenide was chromium (Cr) doped to make the gallium arsenide semi-insulating. With the doping, the slab had a resistivity of $1 \times 10^6$ ohms-cm. Since the carrier lifetime in this type of gallium arsenide is less than 100 picoseconds, Lee found that the GaAs optoelectronic switch did not require an optical pulse to switch it "off" as did the silicon device of Auston.

Both the Si and GaAs devices have generally been fabricated in geometries that required a high peak laser power and a very low-repetition-rate laser. For high speed signal processing, high repetition rate laser pulses are required and the laser will have relatively low peak power. The fast response of the GaAs switch makes it the more attractive device for high speed applications. However, attempts to fabricate efficient GaAs switches and use them with high repetitive rate lasers have led to disappointingly high on-state impedance (500 ohms-1000 ohms). While the reason for this is not fully understood, it is believed to be associated with fundamental GaAs materials properties (e.g., high surface recombination velocity). Accordingly, a need still exists for an optoelectronic switch which, in conjunction with a high repetition rate laser, has a very fast response time on the order of 50 picoseconds or less and a low on-state impedance on the order of 50 ohms or less. In this connection, it should be noted that on-state impedance is critical in a switch inasmuch as the lower the on-state impedance, the greater the sensitivity of the switch.

DISCLOSURE OF THE INVENTION

This invention relates to an indium phosphide (InP) optoelectronic switch. The switch is fabricated from an indium phosphide wafer which is made semi-insulating by introduction of a deep level impurity such as an iron (Fe) or chromium (Cr) dopant. A semi-insulating structure is one which is highly resistive (on the order of $1 \times 10^6$ ohms-cm or greater) but is not a pure insulating element such as glass. The indium phosphide semi-insulating substrate serves as the dielectric in a microstrip transmission line. The top strip on the transmission line is a narrow striped metallic conductor which has a small gap located along the strip at about the mid-point of the strip.

On both sides of the gap, the metallization is thin and optically semi-transparent for a short distance along the strip. This improves the optical input coupling efficiency and reduces any nonohmic contact effects by allowing photons to be introduced under the semi-transparent metal as well as in the gap region thereby reducing the switch on-state impedance. The on-state impedance is also proportional to the square of the gap length and is thus substantially smaller, for the same focused optical power, than it would have been if only thick metallization were used for the entire stripe (with the same gap geometry or with a gap defined by the original thick metal). By proper gap design and processing of the InP, it is possible to effectively operate the switch ($R \leq 50\Omega$) with relatively low laser pulse power, such as is available from GaAs diode lasers or small frequency doubled Nd:YAG lasers.

This invention also relates to an improvement in the process of fabricating optoelectronic switches which consists of subjecting the device to a heat treatment at elevated temperatures for a predetermined period of time. While the exact nature of the process involved is not at the present time fully understood, it has been found in accordance with this invention that such a heat treatment dramatically reduces the response time of optoelectronic switches, and, in particular, indium phosphide optoelectronic switches. Thus, for example, by subjecting the chemically etched and strip lined iron doped indium phosphide optoelectronic switch to a temperature of 400° C. in a hydrogen atmosphere for 5 seconds, the response time was reduced from 1 nanosecond to 50 picoseconds.

In view of the improvements made by the optoelectronic switch herein described, several new and important applications can be practically implemented by this device, such as, for example, analog sampling, waveform gating and modulation, high speed photodetection over a broad optical bandwidth and high voltage pulse generation. These and other applications and embodiments of the invention will be described in greater detail in connection with the drawings.

BRIEF DESCRIPTION OF THE DRAWINGS

FIG. 1 is a perspective view in partial schematic form of a optoelectronic switch in accordance with the invention;

FIG. 2(a)-(k) is a series of section views showing the fabrication of an optoelectronic switch of the invention in the various process stages;

BEST MODE OF CARRYING OUT THE INVENTION

Figure 3:
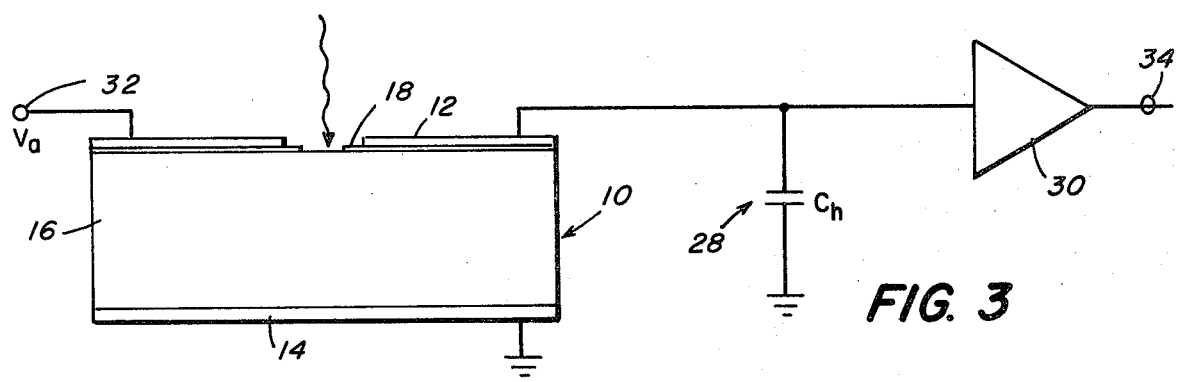
FIG. 3 shows an application of the optoelectronic switch of the invention as an element in an optically controlled track and hold circuit.

The invention will now be described in more detail with particular reference to FIG. 1.

In FIG. 1 an optoelectronic switch 10 is shown comprising a semi-insulating indium phosphide substrate 16 disposed between two planar conducting surfaces 14 and 12. One of said planar conducting surfaces 12 is provided with a small gap which is located at about the mid-point of the metallized strip 12. The width of this gap is identified as T' and in a preferred embodiment of the invention is on the order of 10 μm wide. A semi-transparent layer of gold 18 about 100-200 angstroms thick is provided between conductive strip 12 and the semi-insulating substrate 16. This optically semi-transparent layer projects into the space or gap provided between the opposing surfaces of strip 12 a distance such that a second gap of width T is provided intermediate the first referenced gap of width of T'. In a preferred embodiment, this electrically conductive, optically semi-transparent layer has a gap between opposing layer surfaces of about 3 μm. The switch 10 is normally off in the "off" or non-conductive state, but when the gap is illuminated with an intense laser pulse, photons are absorbed near the surface of the semi-insulating substrate 16 and a photogenerated electron-hole plasma forms a conducting path across the gap turning the switch on. Thus, in operation, a signal provided at the terminal labelled "$V_{in}$" may be switched and passed to the terminal labelled "$V_{out}$" by pulsing a laser (not shown) which would provide laser light pulses at the gap. The optically semi-transparent layer 18 provided in the switch 10 improves the coupling efficiency of the focused laser light while at the same time maintaining a relatively small nonconductive gap and thus, a relatively low on-state impedance. This results from the fact that the on-state resistance varies as the square of the gap width for a constant optical input power.

Referring now to FIG. 2, the process steps required to fabricate the device as shown in FIG. 1 will be described in detail. First, a polished semi-insulating indium phosphide wafer 20 is cleaned using standard solvents and then etched in a suitable etching solution for 3 minutes to remove 10 μm of material in order to remove any residual polishing damage. A suitable etchant solution is an etchant comprised of one part HCl, 6 parts $HNO_3$, 1 part $HClO_4$ and 1 part $CH_3COOH$. FIG. 2A shows the etched semi-insulating indium phosphide wafer. (The wafer is made semi-insulating by diffusion or introduction of a suitable dopant such as iron or chromium acceptor impurities during the growth of the ingot). Next, as shown in FIG. 2B, a 200 angstrom thick optically semi-transparent layer of gold is sputtered deposited on the wafer 20. The gold semi-transparent layer 21 is patterned into strips 30 μm wide and 1 cm long with a 3 μm gap 27 placed mid-way along the 1 cm length using standard photolithographic and chemical etching techniques and photoresist 22 as shown in FIGS. 2C and 2D. The device is then cleaned in solvents, and as shown in FIGS. 2E and 2F, photolithographically processed to form a photoresist plating mask 23. Gold strips 26 may then be electroplated as shown in FIG. 2G up to a 1.5 μm thickness, except for a 10 μm wide region shown at 24 which is centered on the 3 μm gap at 27.

Next, the wafers are annealed or heat-treated in a hydrogen atmosphere as appropriate for the desired device response time. In general, it was found that switches without heat-treatment had a response time of 1 nanosecond while those annealed or heat-treated for 5 seconds at 400° C. had a response time as short as 50 picoseconds. Devices heat-treated at intermediate temperatures below 400° C. had a corresponding intermediate value of response time. While the exact scientific reasons for improvement in response time is not presently understood, it is believed that this heat-treatment changes the bulk properties of the indium phosphide substrate rather than just the surface characteristics, such as, surface recombination time constants; since in one experiment, it has been found that etching a 100 angstrom layer off the surface of a switch heat-treated at 400° C. had no significant effect on the device response speed. Following heat treatment, the switch is etched in a pH-10 mixture of $H_2O_2$ and $NH_4OH$ for about 75 seconds. The pH-10 etch is used to restore the surface resistivity of the switch after fabrication. Finally, the switches are cleaved and mounted with silver paint in a gold plated microwave package.

In some embodiments, the switches were formed with alloyed n-type contacts of gold-tin or gold-germanium to increase the range of voltages over which the switch would have a linear photocurrent response. Such an embodiment is shown in FIG. 2h wherein a 300-500 angstrom film of gold-tin or gold-germanium 25 was patterned on a bare semi-insulating indium phosphide surface in place of the thin gold metallization described in FIGS. 2b-d. This pattern was then alloyed at a temperature of 400° C. for 5 seconds as shown in FIG. 2i. A photoresist plating mask 13 was then applied as shown in FIG. 2j and, as shown in FIG. 2k, gold 15 was then plated over the alloyed region to a thickness of about 1.5 μm and the switches were treated with the pH-10 etch, cleaved and mounted for testing. The pH-10 etch is used to restore the surface resistivity of the switch after fabrication.

One of the most promising applications of the indium phosphide switch heretofore described is to use the switch as part of a high-speed track and hold circuit. Such a circuit could be used in a variety of signal acquisition applications (e.g. Analog-to-Digital converters) in place of the more conventional diode bridge circuits. One embodiment of the circuit is shown in FIG. 3. (Note that corresponding elements in FIG. 3 and FIG. 2 are correspondingly designated in the drawings herein for ease in identification.) In the apparatus of FIG. 3, an analog voltage signal is applied at terminal 32 which is connected to one end of metal strip 12. This analog voltage signal may be sampled by pulsing the gap between strip 12 with a laser pulse of high intensity, in which case the electrical circuit from terminal 32 will be completed to one end of capacitor $C_h$, labeled 28, by the laser generated plasma stream on the surface of semi-insulating substrate 16. Thus, the analog voltage $V_a$ at terminal 32 may be fully acquired by charging hold capacitor $C_h$ at 28 for a time, at least equal to several RC time constants of the on-state switch resistance "R" of switch 10 and the capacitance of capacitor $C_h$. A buffer amplifier 30 may also be provided between capacitor 28 and the output terminal 34.

The circuit of FIG. 3 has the advantage of complete isolation of the sampling command pulse (i.e., the signal that initiates laser light pulse generation) from the analog signal $V_a$. This eliminates ringing or "pick-up" effects common with circuits having all electronic components. Secondly, the device has a zero DC offset which simplifies the support circuitry. Also, optoelectronic switches are truly time varying linear devices and do not present the non-linear effects common with diode bridges. Lastly, the switch of FIG. 3 has a high off-state impedance in excess of 100 megaohms, with a low capacitance of less than 0.01 picofarad. Furthermore, it is possible with well known integrated circuit techniques to fabricate all of the components of FIG. 3 on one substrate.

Figure 4:
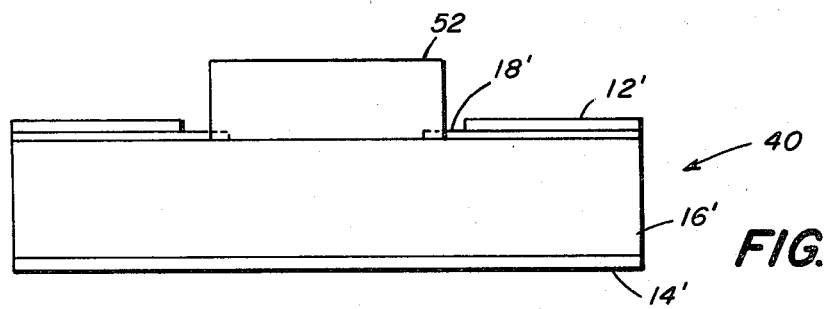
FIG. 4 is a top view of a switch with a heterojunction window layer.

Referring now to FIG. 4, there is shown a further embodiment of the invention in which a buried heterostructure switch 40 is shown which has an upper semiconductor window 52. This upper semiconductor window 52 is formed on the top of an optoelectronic switch which is fabricated substantially as shown in FIGS. 1 and 2 and earlier described. This window 52 may be either a chemically-vapor deposited body or may be fabricated by other epitaxial techniques.

The structure underneath the window 52 consists of a substrate 16' of semi-insulating indium phosphide mounted on a planar conducting surface 14'. A metallized strip 12' is provided on top of the substrate 16' as in FIG. 1. The window 52 is located on the gap provided between the opposing surfaces of strip 12'. The gap may also have a thin semi-transparent metallized layer 18', as in FIG. 1. While it is more difficult to form a window layer if the thin metallized strip 18' is included in the gap, it is contemplated that this could be accomplished by well known molecular beam epitaxy techniques.

The upper window layer may preferably consist of an Indium Aluminum Arsenide (InAlAs) alloy formed on the Indium Phosphide body 16'. It is desirable to assure lattice matching of the window layer to the body in order to reduce surface recombination velocity. Use of InAlAs will produce a good lattice match with the InP switch body; thus maximum benefit will be derived from the heterostructure.

The band gap of InAlAs is less than or equal to about 0.8 μm and is therefore transparent to laser radiation of about 0.8 μm, such as, a gallium aluminum arsenide laser. The indium phosphide body 16' underneath will become conductive at the surface in response to laser radiation of wavelength greater than 0.9 μm. Therefore, the combination of an InAlAs window with an indium phosphide switch is a good match.

The window layer 52 should improve switch efficiency by reducing the surface recombination velocity at the interface of window 52 and switch body 16' and because none of the incident light energy will be absorbed in layer 52. A similar improvement may be achieved by use of optically transparent passivation coatings, such as optically clear deposited oxides in lieu of a deposited heterostructure.

Figure 5:
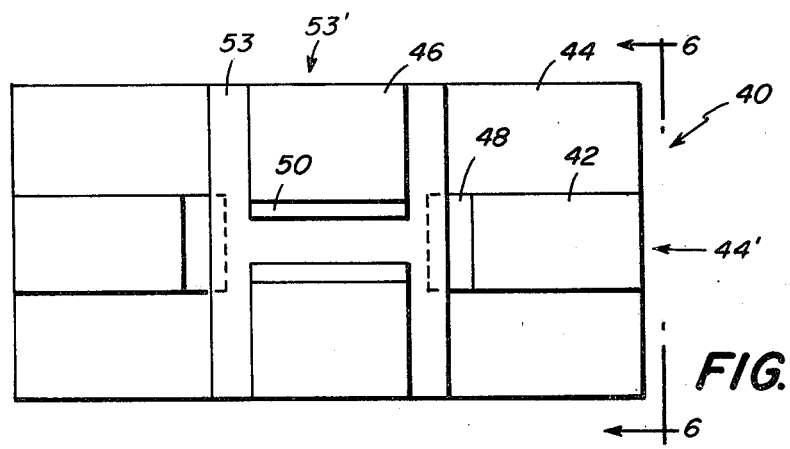
FIG. 5 is a top view of a dual-frequency embodiment of the invention.
Figure 6:
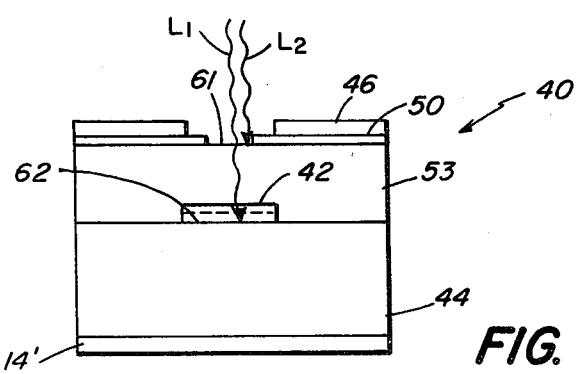
FIG. 6 is a side view of FIG. 5 taken along lines 6—6 of FIG. 5.

Referring now to FIGS. 5 and 6, there is shown a further embodiment of the invention which may be generally described as a dual wavelength switch. In this embodiment, a pair of optoelectronic switches 53' and 44' are disposed with respect to one another such that the gaps on each one in registry with one another. The upper switch 53' consists of a semiconductor body 53, which has a top metallized strip 46 provided with a gap as shown in FIG. 6 between the two opposing surfaces of the strip 46. A semi-transparent, thin layer of gold 50 is also formed at the gap between opposing surfaces of metallized strip 46. The lower switch 44' consists of a different semiconductor body 44, with a top metallized strip 42 provided with a gap as also shown in FIG. 6. A thin semi-transparent Au layer 48 is also formed at the gap between the opposing surfaces of strip 42. A back metallized contact 14' is also provided. As can thus be seen, there are formed in the gap area shown generally at 61, two surface areas, one underneath each other, 61 and 62, which may be rendered conductive by light of different frequencies. For example, light frequency $L_1$ may penetrate to surface layer 62 causing a photogenerated electron-hole plasma across the gap between metallized layer 42 turning switch 44 "On." In the alternative, if the incoming light is at a frequency $L_2$ such that it will not penetrate semiconductor body 53, the plasma will be formed at surface layer 61, thus turning on switch 53'. The device in FIGS. 5 and 6 may thus have the advantage of reducing surface effects at surface 62 while at the same time, providing the potential for a dual wavelength device.

In a preferred embodiment the lower switch body 44 would be formed from a high resistivity layer of Indium Gallium Arsenide Phosphide having a bandgap of approximately 1.2 μm and the upper body 53 would consist of an Indium Phosphide layer having a 0.9 μm bandgap. Such a structure could be grown on an Indium Phosphide substrate (not shown) which could be polished off. This choice of body structures would provide a good lattice match at the interface.

While the devices described herein consist of indium phosphide substrates sandwiched between top and bottom parallel conductive layers, it is contemplated that other transmission line configurations will benefit from this invention as well. For example, the conductive layers may both lie in the top of the substrate parallel to each other such that the substrate is intermediate the two coplanar parallel conductive strips, one of which has a nonconductive gap. Such structures would also allow one to easily perform shunt modulation, where lasergenerated plasma would form a conducting path between the electrodes.

Those skilled in the art may recognize other equivalents to the specific embodiments described herein, which equivalents are intended to be encompassed by the claims attached hereto. For example, the simple gap geometry shown in the embodiments may be modified to provide various other configurations such as interdigitated designs of a strip line form.

Figure 7:
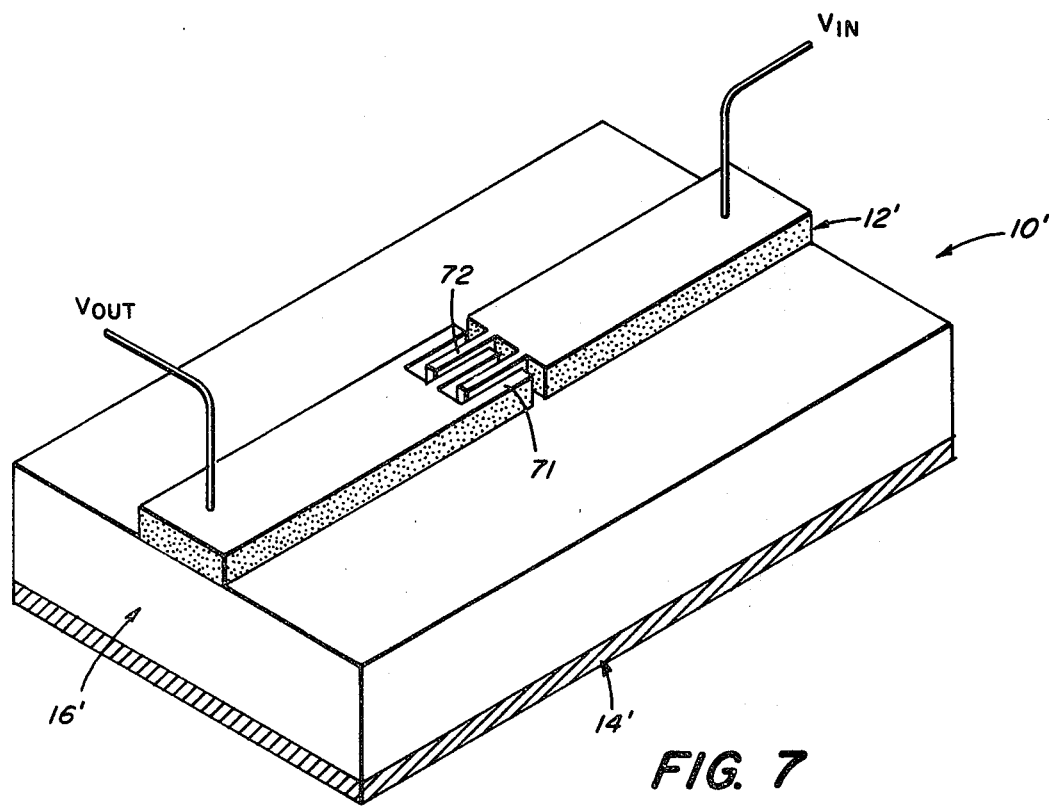
FIG. 7 is a top view of a switch with an interdigitated-finger gap.

The interdigitated structure is shown in FIG. 7 wherein a gap consisting of the spaces between interdigitated fingers 71 and 72 is provided between opposing surfaces of metal strip 12'. Strip 12' is fabricated on semi-insulating body 16' as previously described in connection with FIGS. 1 and 2 to form an opto-electronic switch 10'. The gaps may be made quite small, on the order of 0.5 microns and will produce ON-state impedances comparable to or lower than the gap designs previously described above.

For light sources which can't be focused to small spot sizes, the interdigitated structure will effectively spread out the gap and thus greatly improve the optical coupling efficiency and yield a relatively low ON-state impedance. The fingers 71 and 72 can also be fabricated from optically semi-transparent metal thereby further improving deivce performance.

Ion implantation could be used to modify the device technology and performance. That is, areas under the electrodes could be implanted to improve their ohmic characteristics. In addition, it may be possible to modify the device response time by implantation damage effects. Additionally, an antireflective coating could be provided over the gap region thereby increasing the amount of incident light absorbed by the switch. Lastly, it should be noted that the heat treatments described herein may effectively utilize ambient environments other than hydrogen gas.

We claim:

1. An optoelectronic switch responsive to low power high repetition rate photon pulses comprising:
   a semi-insulating indium phosphide substrate disposed intermediate a pair of parallel electrically conducting surfaces one of said layers having an electrically non-conductive gap defined by at least two edges of said one electrically conductive layer which upon being illuminated by photons is rendered electrically conductive.

2. The switch of claim 1 wherein an electrically conductive optically semi-transparent layer is provided in contact with at least one gap defining edge but not totally bridging said gap on the surface of said substrate.

3. The switch of claim 1 wherein the switch has a decreased response time caused by a heat treatment.

4. An optoelectronic switch comprising:
   a. a semi-insulating indium phosphide substrate disposed between two planar conducting surfaces;
   b. one of said planar conducting surfaces having a non-conducting space providing a non-conductive gap on said surface and which upon being illuminated by photons a photogenerated plasma forms a conducting path across the gap thereby completing an electrical circuit.

5. The switch of claim 4 wherein a conductive layer partially transparent to light is provided at said gap but not totally across said gap to decrease the non-conducting width of said gap yet retain the ability of the underlying substrate to absorb photons.

6. The switch of claim 5 wherein said switch has a decreased response time caused by an annealing treatment.

7. The switch of claim 5 wherein said switch has substantially reduced time constant to complete the circuit in response to said photons or to interrupt the circuit when the photons are not present, said reduced time constant caused by a heat treatment at a sufficient temperature and for a sufficient duration of time.

8. In an optoelectronic switch having a semi-insulating substrate intermediate two planar electrically conductive layers one of which has a space therein providing an electrically non-conductive gap with edges:
   the improvement comprising an electrically conductive, at least partially optically transparent, planar layer disposed in said gap in contact with both edges of said gap but not extending completely across said gap.

9. The apparatus switch of claim 8 in which said layer is provided for by a thin layer of gold on the order of 100-200 angstroms in thickness.

10. The switch of claim 9 in which the non-conducting gap left after the thin layer is provided is in the order of 3 micrometers across.

11. An optoelectronic switch comprising:
   a. a first electrically conductive strip;
   b. a second electrically conductive strip having a non-conductive gap;
   c. a semi-insulating substrate of InP intermediate said first and second strips; and
   d. an optically clear non-oxide window of material lattice matched to the substrate forming a layer over said gap.

12. The switch of claim 11 in which the window layer reduces surface combination velocity and the window layer is an InAlAs lattice matched to the semi-insulating substrate.

13. A dual frequency optoelectronic switch comprising:
   a first device having a semi-insulating substrate intermediate first and second electrically conductive strips the first of said strips having a non-conducting gap;
   a second device with a semi-insulating layer intermediate first and second electrically conductive strips the first of said strips having a non-conductive gap and the second of said strips being common with the second strip of said first device;
   said first and second devices being disposed adjacent one another so that the nonconducting gaps are in registry.

14. The apparatus of claim 13 wherein the semi-insulating layer of second said device is at least partially transparent to photons of a certain frequency band and is substantially non-transparent to photons of another frequency band.

15. An optoelectronic switch comprising first and second electrically conductive planar strips, the first said strip interrupted by a non-conductive gap, said strips being mounted in parallel on a semi-insulating substrate; the improvement comprising the first conductive strip formed by a pair of circuitous electrically conductive paths, said paths not short-circuiting by means of a circuitous non-conductive gap formed therebetween.

16. The apparatus of claim 15 in which the paths consist of sets of interdigitated fingers, one set connected to one path and the other set being connected to the opposite path.

* * * * *